United States Patent
Chan Arguedas et al.

(10) Patent No.: US 10,672,625 B2
(45) Date of Patent: Jun. 2, 2020

(54) ELECTRONIC DEVICE PACKAGE WITH RECESSED SUBSTRATE FOR UNDERFILL CONTAINMENT

(71) Applicant: Intel Corporation, Santa Clara, CA (US)

(72) Inventors: Sergio A. Chan Arguedas, Chandler, AZ (US); Joshua D. Heppner, Chandler, AZ (US); Jimin Yao, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/083,611

(22) PCT Filed: Apr. 1, 2016

(86) PCT No.: PCT/US2016/025629
§ 371 (c)(1),
(2) Date: Sep. 10, 2018

(87) PCT Pub. No.: WO2017/171850
PCT Pub. Date: Oct. 5, 2017

(65) Prior Publication Data
US 2019/0074199 A1    Mar. 7, 2019

(51) Int. Cl.
*H01L 21/56*    (2006.01)
*H01L 23/00*    (2006.01)
(Continued)

(52) U.S. Cl.
CPC ............ *H01L 21/563* (2013.01); *H01L 23/13* (2013.01); *H01L 23/3142* (2013.01);
(Continued)

(58) Field of Classification Search
CPC ... H01L 21/563; H01L 23/3142; H01L 24/83; H01L 24/81; H01L 24/73; H01L 23/13;
(Continued)

(56) References Cited

U.S. PATENT DOCUMENTS 6,207,475 B1 * 3/2001 Lin ................. H01L 21/563
257/778
8,330,266 B2 * 12/2012 Yui ................. H01L 23/16
257/692
(Continued)

FOREIGN PATENT DOCUMENTS

JP    2001244384 A    9/2001
JP    2005175261 A    6/2005

OTHER PUBLICATIONS

International Search Report dated Feb. 12, 2016, in International Application No. PCT/US2016/025629, filed Apr. 1, 2016, 4 pages.

*Primary Examiner* — Sonya D. McCall-Shepard
(74) *Attorney, Agent, or Firm* — Thorpe North and Western, LLP; David W. Osborne

(57) ABSTRACT

Electronic device package technology is disclosed. In one example, an electronic device package can include a substrate having a recess, an electronic component disposed in the recess and electrically coupled to the substrate, and an underfill material disposed in the recess between the electronic component and the substrate. Associated systems and methods are also disclosed.

16 Claims, 8 Drawing Sheets

(51) Int. Cl.
*H01L 23/31* (2006.01)
*H01L 23/13* (2006.01)
*H01L 23/15* (2006.01)
*H01L 23/14* (2006.01)

(52) U.S. Cl.
CPC .............. *H01L 24/16* (2013.01); *H01L 24/27* (2013.01); *H01L 24/32* (2013.01); *H01L 24/73* (2013.01); *H01L 24/81* (2013.01); *H01L 24/83* (2013.01); *H01L 24/92* (2013.01); *H01L 23/145* (2013.01); *H01L 23/15* (2013.01); *H01L 24/13* (2013.01); *H01L 2224/131* (2013.01); *H01L 2224/16227* (2013.01); *H01L 2224/27013* (2013.01); *H01L 2224/2732* (2013.01); *H01L 2224/32225* (2013.01); *H01L 2224/73204* (2013.01); *H01L 2224/83007* (2013.01); *H01L 2224/92125* (2013.01); *H01L 2924/15153* (2013.01)

(58) Field of Classification Search
CPC ........... H01L 24/32; H01L 2224/27013; H01L 2224/2732
See application file for complete search history.

(56) References Cited

U.S. PATENT DOCUMENTS

| | | |
|---|---|---|
| 9,054,100 B2* | 6/2015 | Lee .................. H01L 23/49894 |
| 2003/0064549 A1* | 4/2003 | Saitou .................. H01L 21/563 |
| | | 438/127 |
| 2006/0049522 A1 | 3/2006 | Libres et al. |
| 2009/0283317 A1 | 11/2009 | Ozawa |
| 2010/0061056 A1* | 3/2010 | Searls .................. H01L 21/563 |
| | | 361/679.56 |
| 2010/0271792 A1 | 10/2010 | Choi et al. |
| 2015/0255312 A1 | 9/2015 | Brofman et al. |
| 2016/0042978 A1 | 2/2016 | Wang et al. |

* cited by examiner

ELECTRONIC DEVICE PACKAGE WITH RECESSED SUBSTRATE FOR UNDERFILL CONTAINMENT

PRIORITY DATA

This application is a 371 U.S. national stage entry of PCT Application Serial No. PCT/US2016/025629, filed Apr. 1, 2016, which is incorporated herein by reference.

TECHNICAL FIELD

Embodiments described herein relate generally to electronic device packages, and more particularly to controlling the flow of an underfill material over the surface of a substrate.

BACKGROUND

Electronic devices, which include a chip component joined to a substrate, are often vulnerable to crack formation. In particular, cracks tend to appear along the bond lines around attachment structures such as bumps, including either between the bump and the component or between the bump and the substrate. Cracks may occur in manufacturing or use when the materials of the substrate and/or electronic device are subjected to thermal forces and expand and contract at different rates. Such cracks are a major source of device failure in chip components. Underfill techniques and materials are extensively used in semiconductor manufacturing in an effort to stabilize chip components and help prevent device failure.

One common underfill technique is "capillary underfill". Capillary underfill typically involves flowing an adhesive material between the component and the substrate, so that it contacts both the component and the substrate as it is drawn into and through an intervening gap between them by a wicking action. When functioning properly, the underfill will migrate completely beneath the component, displacing all air and reaching to all the edges of the chip component. The underfill may then be cured to form a substantially rigid material surrounding and strengthening each attachment joint. This allows the materials to better withstand the stresses applied to attachment structure bond lines during thermal variation. At each edge of the component, a generally concave fillet of underfill material may form, extending from the component to the substrate surface only a short distance beyond the peripheral boundary of the component.

After it is dispensed, the flowable adhesive may flow not only into and through the gap between the component and the substrate, but also away from the dispense point and the component, across the surface of the substrate. Once cured, this "counter-directional" flow forms an "extended fillet" or "tongue" of underfill material. This generally unimpeded flow away from the component necessitates, in many instances, the use of more underfill than is necessary to simply fill the component-substrate gap, and the underfill material comprising the extended fillet is essentially wasted. Further, the area covered by the extended fillet is generally designated a "keep out zone" (KOZ) into which no other components are placed to avoid potentially damaging them. Therefore, on the side of a chip component where an extended fillet of underfill material forms, the substrate surface area beneath the extended fillet is effectively made unavailable for component placement and essentially wasted.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1A:
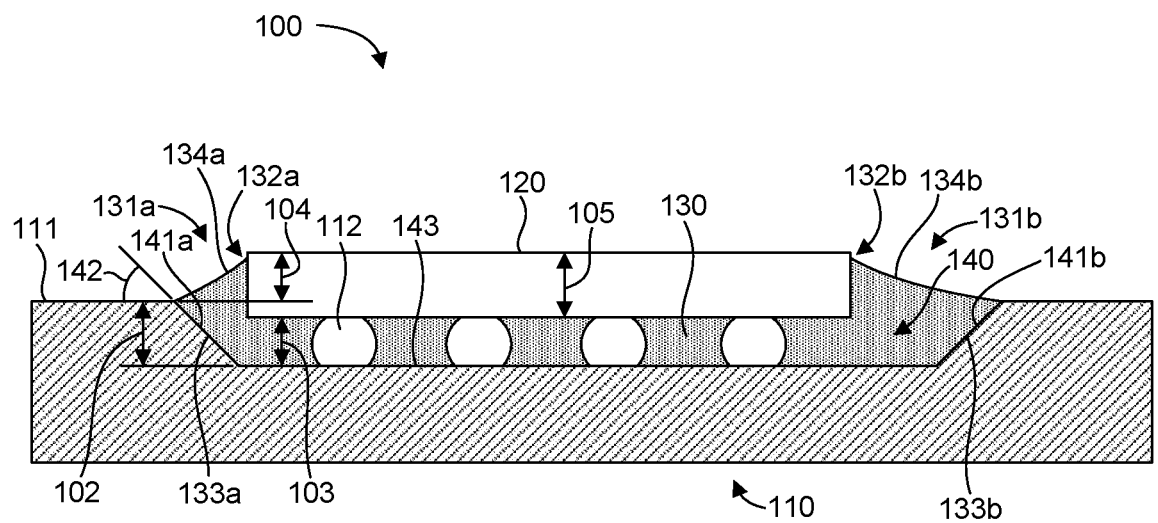
FIG. 1A illustrates a schematic representation of a side cross-sectional view of an electronic device package in accordance with an example.

Reference will now be made to the exemplary embodiments illustrated, and specific language will be used herein to describe the same. It will nevertheless be understood that no limitation of the scope or to specific invention embodiments is thereby intended.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this specification and the appended claims, the singular forms "a," "an" and "the" include plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. patent law. "Consisting essentially of" or "consists essentially of" have the meaning generally ascribed to them by U.S. patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the specification, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order.

It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. It is understood that express support is intended for exact numerical values in this specification, even when the term "about" is used in connection therewith.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

EXAMPLE EMBODIMENTS

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

For the reasons mentioned above it is highly desirable to minimize or eliminate the underfill KOZ, which can facilitate package size reduction and increase the layout density, and thereby lower the package cost. In the case where material is added to form a boundary structure to impede underfill spread, such boundary structures must be considered as part of the overall KOZ. In addition, such boundary structures are such that all spread of the underfill material may occur in the same horizontal plane in X and Y directions across a substrate surface.

Accordingly, electronic device packages are disclosed in which the flow and spread of underfill material is controlled by a structure that does not contribute or factor into the underfill KOZ. In one aspect, underfill KOZ can be reduced, along with underfill volume, by facilitating spread of the underfill in a Z direction (e.g., vertically) in addition to X and Y directions. In one example, an electronic device package can include a substrate having a recess, an electronic component disposed in the recess and electrically coupled to the substrate, and an underfill material disposed in the recess between the electronic component and the substrate. Associated systems and methods are also disclosed.

Figure 1B:
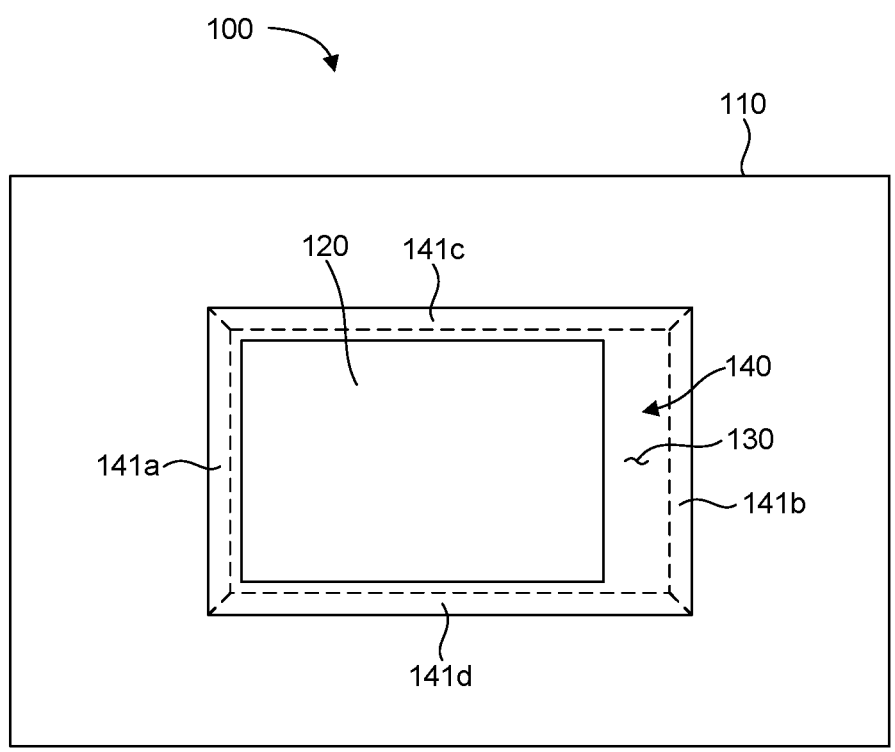
FIG. 1B illustrates a schematic representation of a top view of the electronic device package of FIG. 1A.

Referring to FIGS. 1A and 1B, an exemplary electronic device package 100 is illustrated. In general, the electronic device package 100 can include a substrate 110 and an electronic component 120 disposed or mounted on the substrate 110. The electronic component 120 can be any electronic device or component that may be included in an electronic device package, such as a semiconductor device (e.g., a die, a chip, or a processor). The substrate 110 is represented generally and may be a multilayer substrate including a number of alternating layers of metallization and dielectric material (not shown). Each layer of metallization can comprise a number of conductors (e.g., traces), and these conductors may comprise any suitable conductive material, such as copper or a copper alloy, etc. Further, each metal layer can be separated from adjacent metal layers by the dielectric layers, and adjacent metal layers may be electrically interconnected by conductive vias. The dielectric layers may comprise any suitable insulating material (e.g., polymers, including both thermoplastic and thermosetting resins or epoxies, ceramics, etc.) and the alternating layers of metal and dielectric material may be built-up over a core layer of a dielectric material (or perhaps a metallic core). The substrate 110 can also include a solder resist material or other surface treatment forming an outer layer of the substrate. The electronic component 120 can be mounted to the substrate 110 in any suitable manner, such as using a conventional BGA arrangement in a flip chip configuration in which solder bumps 112 are located between the electronic component 120 and the substrate 110 to electrically couple the electronic component 120 and the substrate 110.

The electronic device package 100 can also include an underfill material 130 disposed between the electronic component 120 and the substrate 110. The underfill material 130 is typically a polymer (e.g., an epoxy) typically applied between the electronic component 120 and the substrate 110 as an underfill encapsulant. The underfill material 130 surrounds the solder bumps 112 and acts to protect the bumps and connection between the electronic component 120 and substrate 110, as well as support the electronic component 120 on the substrate 110.

In addition, the substrate 110 can have a recess 140. As illustrated, the electronic component 120 can be disposed at least partially in the recess 140, and the underfill material 130 can be disposed in the recess 140 between the electronic component 120 and the substrate 110. As described in more detail below, the recess 140 can mechanically inhibit (e.g., physically dam or block) the flow and spread of the underfill material 130 outward from the electronic component 120 and maintain the underfill material 130 in a predefined zone or region about the electronic component 120. Thus, the recess 140 can be configured to establish or define a "keep out zone" into which no other components are placed, so that such other components can avoid contact with the underfill material 130, which may be undesirable. The recess 140 can be of any suitable configuration to accommodate the electronic component 120 and contain the underfill material 130 about the electronic component 120. For example, the recess 140 can include one or more side walls 141a-d that can serve as barriers to the flow or spread of the underfill material 130. The side walls 141a-d can be disposed about a periphery of the electronic component 120. The side walls 141a-d can have any suitable configuration. For example, one or more of the side walls 141a-d can be oriented at a non-perpendicular angle 142 relative to a top surface 111 of the substrate 110. Although the angle 142 is illustrated as less than 90 degrees, it should be recognized that any suitable angle (e.g., 90 degrees or greater than 90 degrees) or configuration is possible. Because solder resist material may be present on the top surface 111 of the substrate 110 and/or disposed in the recess 140 (e.g., about the solder bumps 112 and at least partially forming a bottom surface 143 of the recess 140), the recess 140 may be formed at least partially by solder resist material. Thus, in one example, the side walls 141a-d of the recess 140 can be made entirely or in part of a solder resist layer of material.

The electronic component 120 can be located in any suitable position relative to the recess 140. In some cases, a depth 102 of the recess 140 is equal to or greater than a gap 103 between the electronic component 120 and the bottom surface 143 of the recess 140, which can contribute to the recess 140 effectively damming or blocking the flow of the underfill material 130 to contain the underflow material 130 within the recess 140. Such a configuration can also ensure that the solder bumps 112 are located in the recess 140 at the same or a lower height than the surface 111 of the substrate 110, which can facilitate complete coverage of the solder bumps 112 by the underfill material 130. In one aspect, disposing the electronic component 120 in the recess 140 can result in a lower overall height 104 of the electronic component 120 above the surface 111 of the substrate 110. This depends on the height (e.g., the gap 103) of the interconnect between the electronic component 120 and the bottom surface 143 of the recess 140 and the height or thickness 105 of the electronic component 120. The depth 102 will typically be from about 50 µm to about 1 mm, although this is not meant to be limiting as the depth 102 can depend on the thickness 105 of the electronic component 120.

As illustrated in the side view of FIG. 1A, the underfill material 130 can be in contact with lateral sides 132a, 132b of the electronic component 120. Thus, lateral portions 131a, 131b of the underfill material 130 can extend from the lateral sides 132a, 132b of the electronic component 120 to the substrate 110. The lateral portions 131a, 131b of the underfill material 130 can have lateral side surfaces 133a, 133b defined at least in part by the side walls 141a, 141b, respectively, of the recess 140. The lateral portions 131a, 131b of the underfill material 130 can also have meniscus surfaces 134a, 134b extending between the electronic component 120 and the substrate 110. For example, the meniscus surfaces 134a, 134b can extend between the electronic component 120 and the side walls 141a, 141b of the recess 140.

Figure 2:
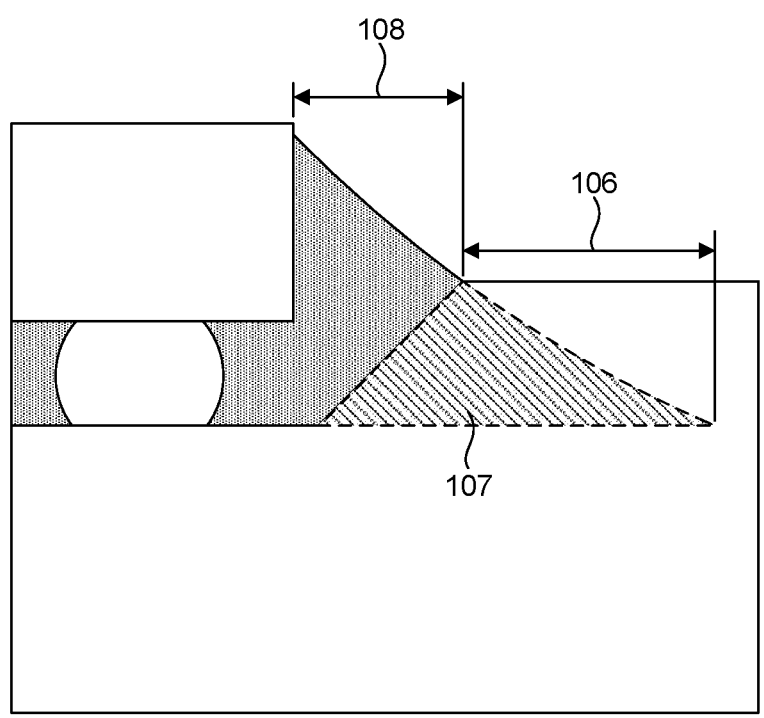
FIG. 2 illustrates a schematic representation of a side cross-sectional view showing underfill KOZ and volume reduction in accordance with an example.

One advantage provided by a recess in a substrate as disclosed herein, in addition to providing a physical barrier to limit the spread of underfill material, is the distribution of the underfill material. In a typical case where underfill material is delivered over a flat substrate surface, the underfill material volume can spread laterally only in X and Y directions (e.g., parallel to the flat surface). The recess adds depth to the underfill material delivery area about an electronic component, so the same underfill material volume will have less lateral or horizontal spread in X and Y directions due to an increased spread in a Z (e.g., vertical) direction in the recess. In other words, the depth of the recess in the underfill material containing area can accommodate the same volume of underfill material in a smaller X-Y area, thereby enabling the underfill KOZ to be reduced or minimized. As a result, the volume of underfill material can be reduced and still provide the required functionality. An exemplary reduction in the underfill KOZ provided by a recess compared to a KOZ on a flat substrate surface is illustrated in FIG. 2 and indicated by reference number 106. Reference number 107 indicates the volume of underfill material that is saved by utilizing a recess, which may vary depending on the specific geometry of the recess, such as the configuration of the side walls. An underfill KOZ distance 108 may be from about 100 µm to about 10 mm, with 250 µm to 4 mm being typical, although these ranges are not meant to be limiting as the dimension 108 will depend on the electronic component.

FIGS. 3-8 illustrate aspects of exemplary methods or processes for making an electronic device package, such as the electronic device package 100. These figures also illustrate aspects of a method for facilitating, controlling, bounding, or otherwise, confining an underfill material keep out zone of an electronic component.

Figure 3:
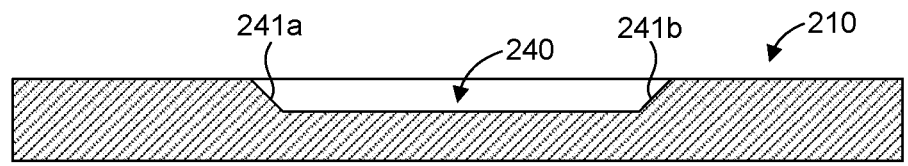
FIG. 3 illustrates a schematic representation of a side cross-sectional view of substrate in accordance with an example of a method for making an electronic device package.
Figure 4:
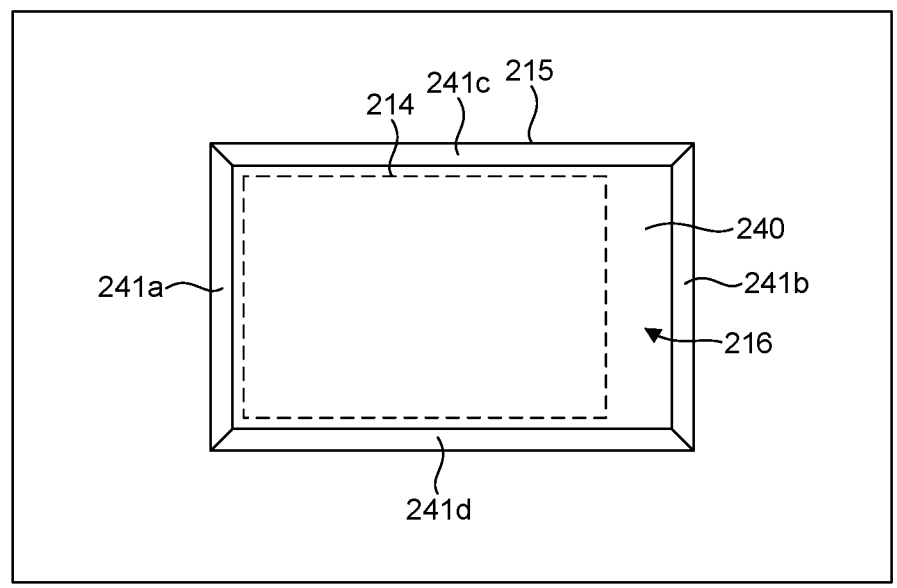
FIG. 4 illustrates a schematic representation of a top view of substrate in accordance with an example of a method for making an electronic device package.

FIG. 3 schematically illustrates a side cross-sectional view of a substrate 210 to which an electronic component can be coupled, and FIG. 4 schematically illustrates a top view of the substrate 210. The substrate 210 can have an electronic component attachment area 214, shown bounded by a dotted line in FIG. 4. The electronic component attachment area 214 is the area on the substrate that will be covered by an electronic component (when viewed from above) when the electronic component is coupled to the substrate 210. Disposed within the electronic component attachment area 214 on the substrate 210 are electrically conductive terminals (not shown), such as an array of pads or lands that are arranged to mate with a corresponding array of terminals formed on the electronic component (e.g., to be flip-chip mounted on the substrate 210). Conductive terminals may comprise copper (or a copper alloy or other metal) pads. It should be understood that the disclosed embodiments are not limited to substrates adapted for flip-chip bonding and, further, that electrically conductive terminals may comprise any type of terminal or element that may be used to form an electrical connection with an electronic component (e.g., bond pads for wire bonding, etc.).

The substrate 210 can also have an electronic component region 215. The electronic component region 215 is shown bounded by a dotted line in FIG. 4, and is at least partially defined by a recess 240 (e.g., by recess side walls 241a-d) in the substrate 210. The electronic component region 215 therefore represents a boundary of where underfill material may flow or spread during subsequent processing. The electronic component attachment area 214 is typically within the electronic component region 215, and therefore the electronic component may be mounted on the substrate 210 within the electronic component region 215. The area between the dotted lines representing the electronic component region 215 and the electronic component attachment area 214 may be referred to as an underfill KOZ 216.

As seen in the top view of FIG. 4, the recess 240 can be formed in the substrate 210 and at least partially defining the electronic component region 215. The recess 240 can control the flow and spread of an underfill material and, hence, inhibit the flow of the underfill material and thereby establish or maintain the underfill KOZ 216 within the electronic component region 215. By mechanically inhibiting (e.g., physically blocking or damming) underfill flow with the recess side walls 241a-d, the size and boundaries of the KOZ 216 can be minimized and maintained, which may be beneficial for small form factor packages. In addition, by utilizing a recess 240 to contain underfill material, there is no structure to contribute or factor into the underfill KOZ 216.

The recess 240 can comprise any opening, cavity, depression, etc. in the substrate 210 defined by a structure suitable for physically blocking the flow and spread of an underfill material. In one embodiment, the side walls 241a-d of the recess 240 can be arranged in a pattern that at least partially defines KOZ 216 or that otherwise mechanically inhibits or prevents the flow or spread of underfill material beyond the KOZ 216. For example, as shown in FIG. 4, the side walls 241*a-d* of the recess 240 may be arranged in a pattern that fully surrounds (or at least substantially surrounds) a perimeter of the electronic component attachment area 214. In another example, the side walls 241*a-d* of the recess 240 can be arranged about fewer than all sides of the electronic component attachment area 214, such as with an open end at an edge of the substrate 210 along one side of the electronic component attachment area 214, to at least partially define the KOZ 216. It should be understood that the side walls 241*a-d* of the recess 240 may be arranged in any desired pattern or configuration, and the pattern that is used may be a function of several factors (e.g., the package form factor, die size, underfill viscosity, the process flow, etc.). In addition, the recess 240 can be formed to have any suitable dimension (e.g., depth, length, and width).

The recess 240 can be formed by removing material from the substrate 210 utilizing any suitable process or technique. For example, the recess 240 can be formed by etching the substrate, mechanically removing material from the substrate, laser removal of material from the substrate, chemical removal of material from the substrate, or any other suitable material removal technique. In one aspect, the recess 240 can be formed at the same time as another material removal step (e.g., removal of solder resist material), which provides an advantage over an additive material approach to forming an underfill boundary that requires additional process steps.

Figure 5:
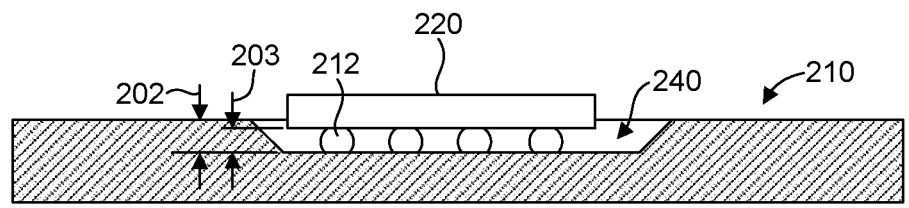
FIG. 5 illustrates a schematic representation of a side cross-sectional view of a substrate having a recess, and an electronic component disposed in the recess in accordance with an example of a method for making an electronic device package.

In one aspect, FIGS. 3 and 4 illustrate an electronic device package precursor, which includes the substrate 210, and the recess 240 in the substrate defining an electronic component region as described above. In another aspect, FIG. 5 illustrates an electronic device package precursor that further includes an electronic component 220 disposed in the recess 240 and electrically coupled to the substrate 210, such as through solder bumps 212. Each of these electronic device package precursors can be subjected to further processing to create an electronic device package in accordance with the present disclosure as described below.

Figure 6:
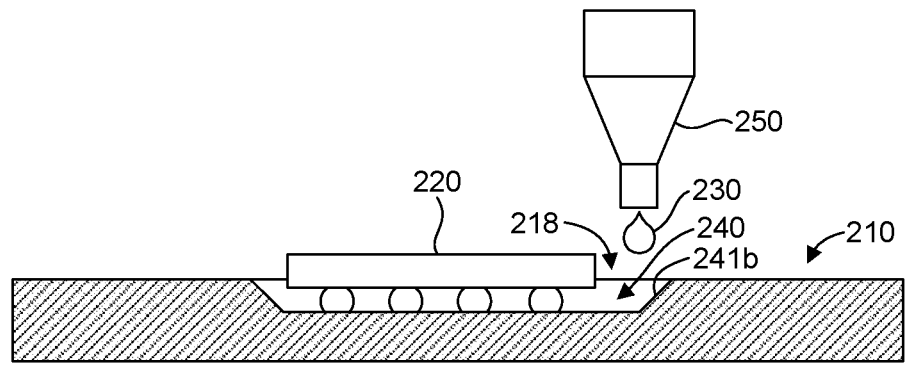
FIG. 6 illustrates a schematic representation of a side cross-sectional view of dispensing underfill material in a recess in accordance with an example of a method for making an electronic device package.
Figure 7:
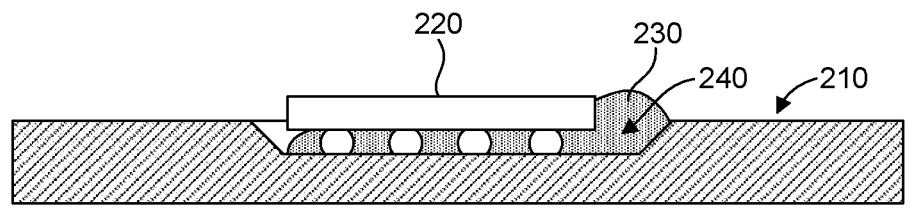
FIG. 7 illustrates a schematic representation of a side cross-sectional view of underfill material spreading in a recess between a substrate and an electronic component in accordance with an example of a method for making an electronic device package.

For example, as shown in FIGS. 6 and 7, underfill material 230 can be disposed in the recess 240 between the electronic component 220 and the substrate 210. The underfill material 230 can be disposed in the recess between the electronic component 220 and the substrate 210 utilizing any suitable process or technique, such as dispensing. Typically, the underfill material 230 would be dispensed in the recess 240, such as with a dispenser nozzle or needle 250, in a region 218 between a side wall (e.g., side wall 41*b*) of the recess 240 and a lateral side of the electronic component 220, as shown in FIG. 6. The region 218 may be provided by a dispense well (discussed in more detail below) configured to receive the underfill material 230. The dispenser nozzle or needle 250 may deliver a predefined volume of underfill material 230 to the recess 240. The underfill material 230 may flow between the electronic component 220 and the substrate 210 using capillary action, as shown in FIG. 7.

The underfill material 230 can form a mechanical bond between the electronic component 220 and the substrate 210, and may also provide support to, and increase the strength of, the electrical connection formed by the solder bumps 212. The underfill material 230 may comprise any material capable of performing one or more of the above-described as well as other functions. In one embodiment, the underfill material 230 comprises an epoxy, such as a polymer epoxy. When formed from an epoxy material, the underfill material 230 is then typically cured to harden the polymer.

Figure 8:
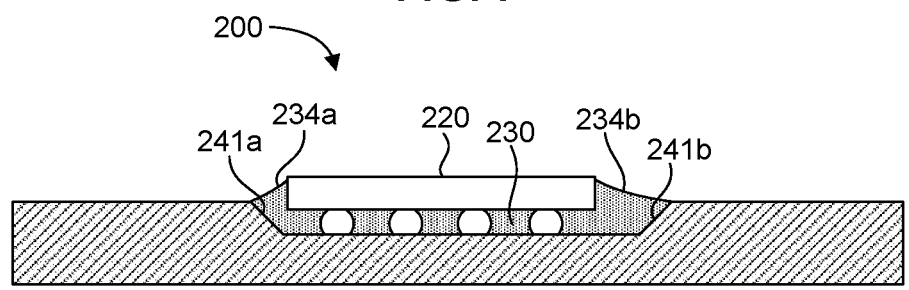
FIG. 8 illustrates a schematic representation of a side cross-sectional view of an electronic device package with underfill material contained by a recess in a substrate in accordance with an example of a method for making an electronic device package.

As shown in FIG. 8, the side walls 241*a*, 241*b* of the recess 240 mechanically inhibit the flow of the underfill material 230. For example, in the illustrated embodiment, the underfill material 230 can flow or spread across the recess 240, but the side walls 241*a*, 241*b* of the recess 240 dam or block the continued outward flow of the underfill material 230 to contain the underfill material 230 substantially within the recess 240. In one aspect, the depth of the recess 240 and the volume of the underfill material 230 can be configured such that the underfill material 230 does not overflow side walls 241*a*, 241*b* of the recess 240. For example, as shown in FIG. 5, a depth of the recess 240 is equal to or greater than a gap 203 between the electronic component 220 and the bottom of the recess 240. With such a recess configuration, when the underfill material 230 is disposed between the electronic component 220 and the substrate 210, as shown in FIG. 8, flow of the underfill material 230 is mechanically inhibited or physically blocked by the side walls 241*a*, 241*b* of the recess 240. Capillary action or surface tension can draw the underfill material up the lateral sides of the electronic component 220 to form meniscus surfaces 234*a*, 234*b* on lateral portions of the underfill material 230 of a completed electronic device package 200.

The recess 240 may be configured to permit whatever amount of spreading of the underfill material 230 is desired. For example, in certain applications, it may be useful to have the underfill material 230 spread a small, uniform distance outward from the electronic component attachment area, for protection. In other applications it may be useful to minimize or have no underfill spread beyond the electronic component attachment area, or to provide for different amounts of underfill spread on different sides of the electronic component attachment area. By controlling or limiting the extent of the flow of the underfill material 230 using the recess 240, the size and boundary of the underfill KOZ can be minimized and/or maintained.

It should be appreciated that the exact shape of the recess 240 and position relative to the electronic component 220 may vary from that shown in FIGS. 5-8. Depending on factors including, for example, the size of the substrate and the presence of other structures on the substrate, the underfill KOZ can be configured to any desired shape and any desired size outside of the electronic component attachment area (even down to zero on all sides), by controlling the location, shape, and size of the recess 240 formed outside of the electronic component attachment area. It should also be appreciated that the electronic component attachment area may have multiple configurations, for example, more or less than four sides, depending on the shape of the electronic component.

In one aspect, multiple electronic components can be disposed in a common recess. Thus, one recess can be used to define or maintain a keep out zone associated with multiple electronic components.

Figure 9A:
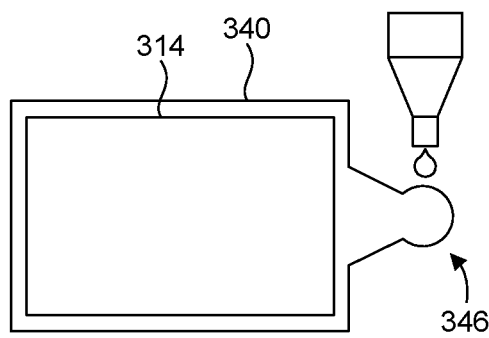
FIGS. 9A-9D illustrate schematic representations of top views of recess dispense wells for receiving underfill material in accordance with several examples.
Figure 9B:
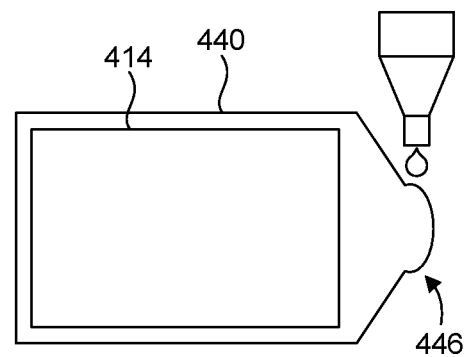
Figure 9C:
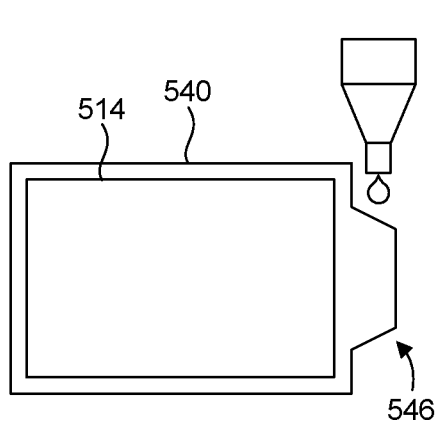
Figure 9D:
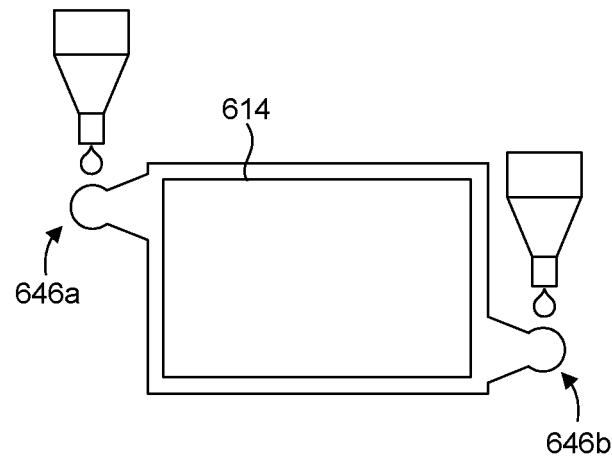

FIGS. 9A-9D illustrate several examples of dispense wells in accordance with the present disclosure. In general, a dispense well can form a reservoir about at least a portion of an electronic component attachment area to receive underfill material and facilitate delivery of the underfill material to the electronic component attachment area. A dispense well can facilitate delivery of underfill material to a specific location about an electronic component attachment area. Thus, a bulk delivery of underfill material can be provided to a specific location, which can reduce dispense time. In one aspect, a dispense well can form a portion of a recess as described herein. For example, as shown in FIGS. 9A-9C, 346, 446, 546 can extend from main body portions of recesses 340, 440, 540 about electronic component attachment areas 314, 414, 514, respectively. FIG. 9D illustrates multiple dispense wells 646a, 646b to receive and deliver underfill material to multiple sides of an electronic component attachment area 614. A dispense well can have any suitable configuration or geometry to accommodate KOZ requirements, some examples of which are illustrated in FIGS. 9A-9D. In one aspect, a dispense well can be configured to receive underfill material from a dispensing nozzle or needle while avoiding a collision between the dispensing nozzle or needle and surrounding components, such as an electronic component. It should be recognized that an electronic device package or precursor as disclosed herein can include one or more dispense wells.

Figure 10:
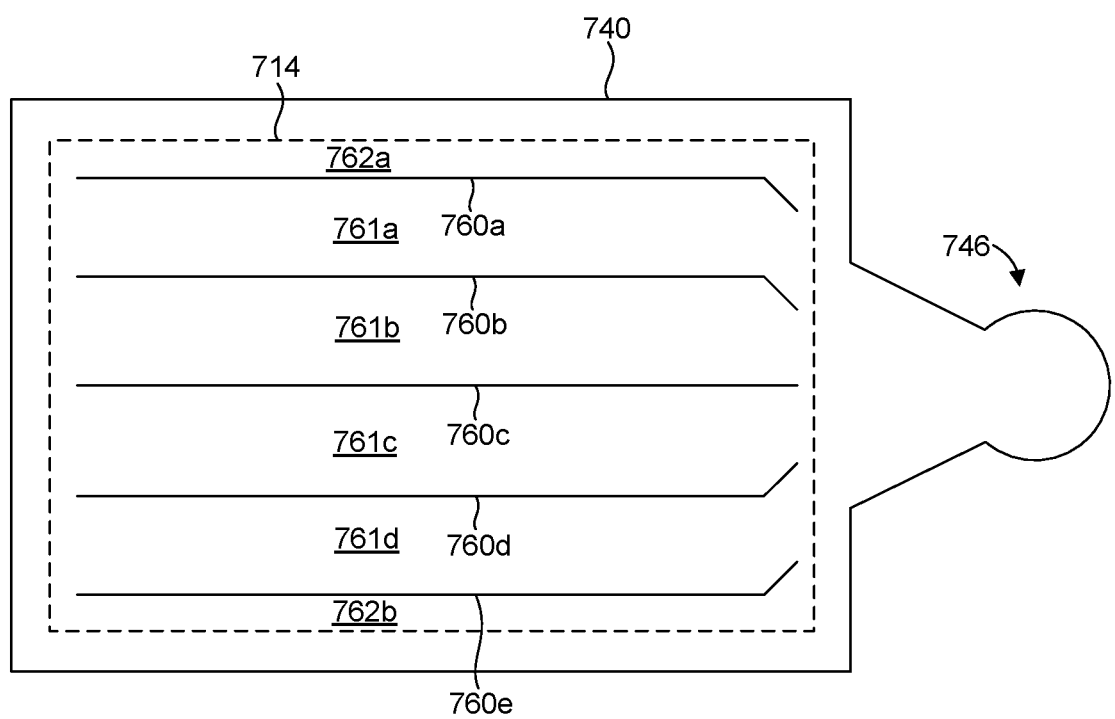
FIG. 10 illustrates a schematic representation of a top view of flow guides for facilitating distribution of underfill material in accordance with an example.

FIG. 10 illustrates an example of flow guides 760a-e to facilitate distribution of underfill material in an electronic component attachment area 714. In one aspect, the flow guides 760a-e can be disposed in a recess 740, which can include a dispense well 746. The flow guides 760a-e can form channels 761a-d between the flow guides, and channels 762a-b between flow guides and side walls of the recess 740. Thus, underfill material can be received in the dispense well 746 and then guided between an electronic component and the substrate by the flow guides 760a-e as the underfill material flows through the channels 761a-d, 762a-b. Such a configuration can improve the run rate of the underfill material in the electronic component attachment area 714.

The flow guides 760a-e can be of any suitable configuration and can be formed or constructed in any suitable manner. For example, on or more of the flow guides 760a-e can have a curve, angle or other such feature or geometry to guide or direct the flow or spread of underfill material. In one aspect, one or more of the flow guides 760a-e can be formed at least partially by one or more traces, such as an electrical trace protruding from the substrate. Although the flow guides 760a-e are shown in the context of a recess as disclosed herein, it should be recognized that flow guides can facilitate the distribution of underfill material between an electronic component and a substrate with or without the presence of a recess. It should be recognized that an electronic device package or precursor as disclosed herein can include one or more flow guides.

Figure 11:
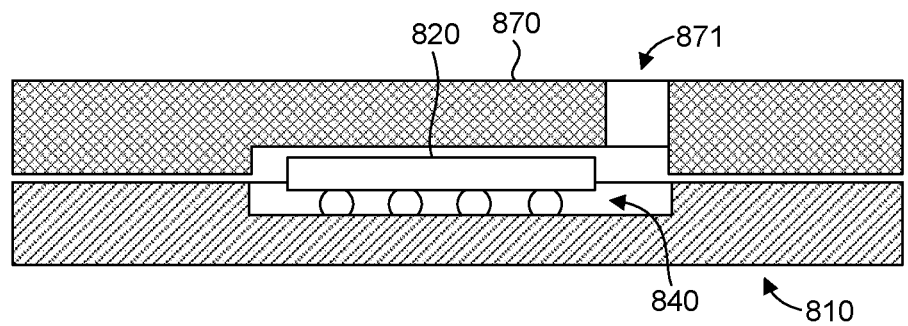
FIG. 11 illustrates a schematic representation of a side cross-sectional view of a printing stencil disposed on a substrate, the substrate having a recess and an electronic component disposed in the recess in accordance with an example of a method for making an electronic device package.
Figure 12:
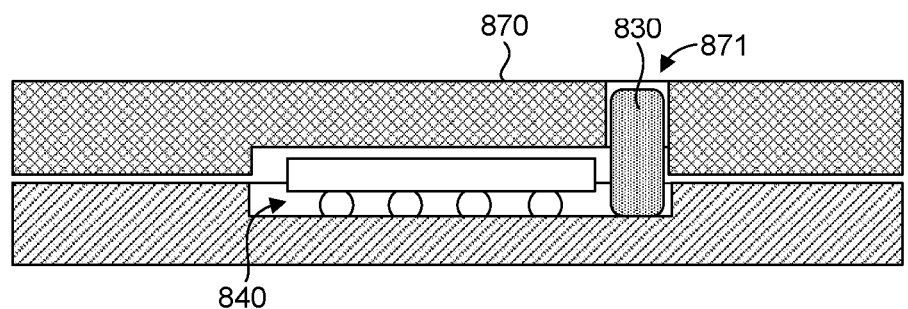
FIG. 12 illustrates a schematic representation of a side cross-sectional view of underfill material transferred through a printing stencil into a recess in a substrate in accordance with an example of a method for making an electronic device package.
Figure 13:
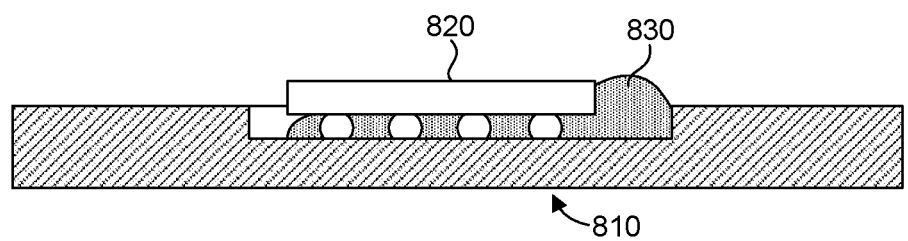
FIG. 13 illustrates a schematic representation of a side cross-sectional view of underfill material spreading in a recess between a substrate and an electronic component in accordance with an example of a method for making an electronic device package.
Figure 14:
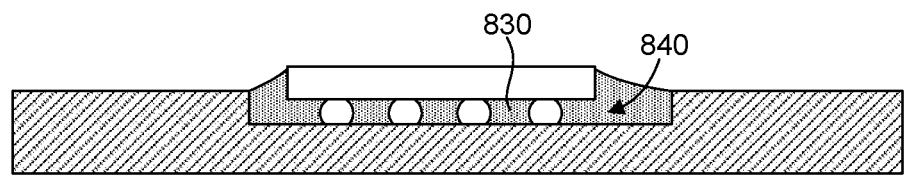
FIG. 14 illustrates a schematic representation of a side cross-sectional view of an electronic device package with underfill material contained by a recess in a substrate in accordance with an example of a method for making an electronic device package.

FIGS. 11-14 schematically illustrate aspects of another process or technique for disposing underfill material in a recess between an electronic component and a substrate as disclosed herein. In this case, underfill material is disposed by printing into a recess of a substrate. For example, as illustrated in FIG. 11, an electronic component 820 can be disposed in a recess 840 and coupled to a substrate 810. In addition, a stencil 870 can be disposed about the substrate 810 and the electronic component 820. The stencil 870 can have an aperture or opening 871 corresponding to an access region of the recess 840, such as a dispense well location. The stencil aperture or opening 871 can be configured with any suitable number of apertures or openings, such as an array or network of small holes, to allow material to pass through the stencil 870 in a suitable arrangement or configuration to facilitate a transfer of underfill material to the recess 840. The stencil aperture or opening 871 can be located about an entire periphery of the electronic component, or about only a portion (e.g., over a dispense well) of the electronic component. FIG. 12 illustrates underfill material 830 passing through the aperture or opening 871 in the stencil 870 and transferred into the recess 840. The volume of underfill material can be controlled by a printing setting and/or the design of the stencil 870 (e.g., aperture size and stencil thickness). In one aspect, a bulk delivery of the underfill material 830 can be provided to a specific location (e.g., a dispense well) by an underfill printing process. Thus, a dispense well can facilitate an underfill printing process. The stencil 870 may be made of material that is non-wet to underfill material (e.g., hydrophobic) or is surface coated with a non-wet material to enhance the release efficiency. Once in the recess, the underfill material 830 can flow between the electronic component and the substrate, as shown in FIG. 13. With the underfill material in the recess 840, the stencil 870 can be removed. The underfill material 830 can spread and flow within the recess 840 to achieve a final form as shown in FIG. 14. In addition to the processes and techniques illustrated herein with regard to providing underfill material to a recess, it should be recognized that any suitable process or technique may be utilized for such purpose.

Figure 15:
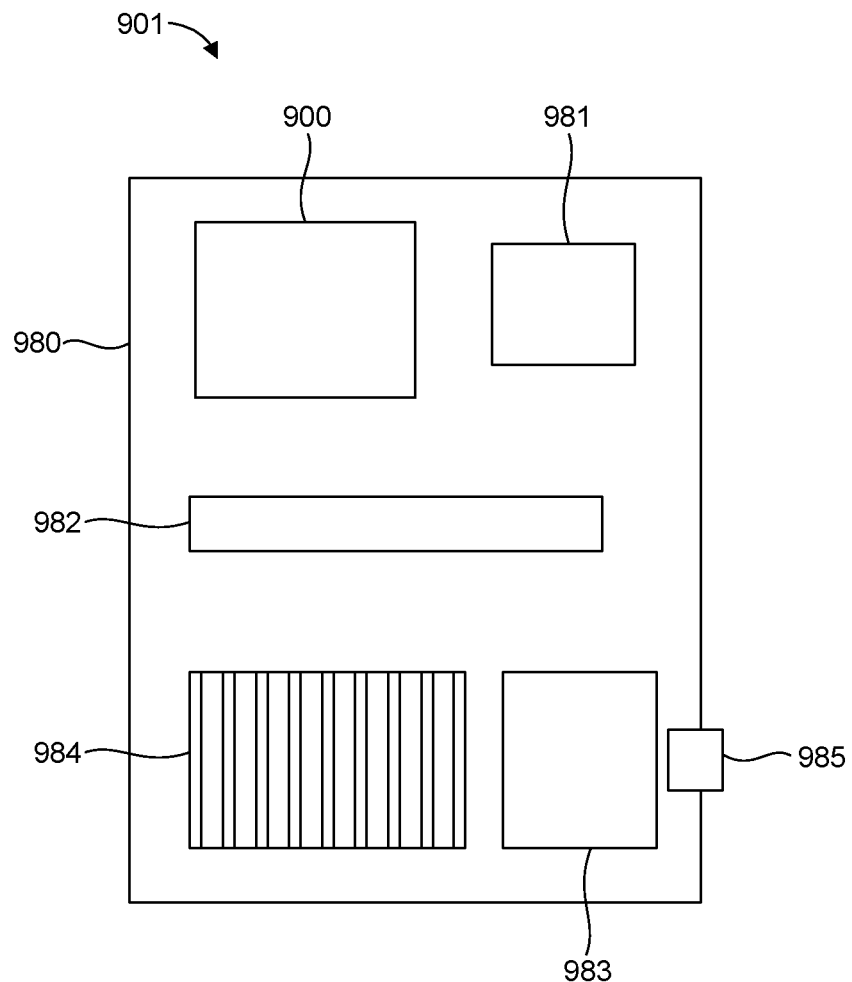
FIG. 15 is a schematic illustration of an exemplary computing system.

FIG. 15 illustrates an example computing system 901. The computing system 901 can include an electronic device package 900 as disclosed herein, coupled to a motherboard 980. In one aspect, the computing system 901 can also include a processor 981, a memory device 982, a radio 983, a heat sink 984, a port 985, a slot, or any other suitable device or component, which can be operably coupled to the motherboard 980. The computing system 901 can comprise any type of computing system, such as a desktop computer, a laptop computer, a tablet computer, a smartphone, a server, etc. Other embodiments need not include all of the features specified in FIG. 15, and may include alternative features not specified in FIG. 15.

EXAMPLES

The following examples pertain to further embodiments.

In one example there is provided, an electronic device package comprising a substrate having a recess, an electronic component disposed in the recess and electrically coupled to the substrate, and an underfill material disposed in the recess between the electronic component and the substrate.

In one example of an electronic device package, at least one side wall of the recess is oriented at a perpendicular angle relative to a top surface of the substrate.

In one example of an electronic device package, at least one side wall of the recess is oriented at a non-perpendicular angle relative to a top surface of the substrate.

In one example of an electronic device package, the recess comprises a dispense well to receive the underfill material.

In one example of an electronic device package, the dispense well comprises a plurality of dispense wells.

In one example of an electronic device package, a depth of the recess is equal to or greater than a gap between the electronic component and a bottom surface of the recess.

In one example of an electronic device package, the recess is formed at least in part by solder resist material.

In one example, an electronic device package comprises one or more flow guides to facilitate distribution of the underfill material in the recess between the electronic component and the substrate.

In one example of an electronic device package, the one or more flow guides form one or more channels in the recess.

In one example of an electronic device package, the one or more flow guides are formed at least partially by one or more traces.

In one example of an electronic device package, a lateral portion of the underfill material comprises a meniscus surface extending between the electronic component and the substrate.

In one example of an electronic device package, a lateral portion of the underfill material comprises a lateral surface defined at least in part by a side wall of the recess.

In one example of an electronic device package, one or more side walls of the recess are disposed about a periphery of the electronic component.

In one example of an electronic device package, the electronic component comprises a semiconductor device.

In one example of an electronic device package, the electronic component is coupled to the substrate through a plurality of solder bumps.

In one example, there is provided a computing system comprising a motherboard, and an electronic device package operably coupled to the motherboard. The electronic device package comprises a substrate having a recess, an electronic component disposed in the recess and electrically coupled to the substrate, and an underfill material disposed in the recess between the electronic component and the substrate.

In one example of a computing system, the computing system comprises a desktop computer, a laptop, a tablet, a smartphone, a server, or a combination thereof.

In one example of a computing system, the computing system further comprises a processor, a memory device, a heat sink, a radio, a slot, a port, or a combination thereof operably coupled to the motherboard.

In one example, there is provided an electronic device package precursor comprising a substrate, and a recess in the substrate defining an electronic component region, wherein a side wall of the recess is configured to mechanically inhibit flow of an underfill material.

In one example, an electronic device package precursor comprises an electronic component disposed in the recess and electrically coupled to the substrate.

In one example of an electronic device package precursor, the electronic component comprises a semiconductor device.

In one example of an electronic device package precursor, the electronic component is coupled to the substrate through a plurality of solder bumps.

In one example of an electronic device package precursor, the side wall of the recess is oriented at a perpendicular angle relative to a top surface of the substrate.

In one example of an electronic device package precursor, the side wall of the recess is oriented at a non-perpendicular angle relative to a top surface of the substrate.

In one example of an electronic device package precursor, the recess comprises a dispense well to receive the underfill material.

In one example of an electronic device package precursor, the dispense well comprises a plurality of dispense wells.

In one example of an electronic device package precursor, the recess is formed at least in part by solder resist material.

In one example of an electronic device package precursor, the side wall of the recess comprises one or more side walls configured to be disposed about a periphery of an electronic component in the electronic component region.

In one example, an electronic device package precursor comprises one or more flow guides to facilitate distribution of the underfill material in the recess between the electronic component and the substrate.

In one example of an electronic device package precursor, the one or more flow guides form one or more channels in the recess.

In one example of an electronic device package precursor, the one or more flow guides are formed at least partially by one or more traces.

In one example there is provided a method for making an electronic device package comprising disposing an electronic component in a recess of a substrate, such that the electronic component is electrically coupled to the substrate, and disposing an underfill material in the recess between the electronic component and the substrate, wherein flow of the underfill material is mechanically inhibited by a side wall of the recess.

In one example of a method for making an electronic device package, disposing an underfill material in the recess comprises dispensing the underfill material in the recess.

In one example of a method for making an electronic device package, disposing an underfill material in the recess comprises printing the underfill material in the recess.

In one example of a method for making an electronic device package, printing the underfill material in the recess comprises disposing a stencil about the substrate, the stencil having an aperture corresponding to a dispense well of the recess.

In one example of a method for making an electronic device package, printing the underfill material in the recess further comprises causing the underfill material to pass through the aperture and into the dispense well.

In one example of a method for making an electronic device package, printing the underfill material in the recess further comprises removing the stencil.

In one example of a method for making an electronic device package, a lateral portion of the underfill material comprises a meniscus surface extending between the electronic component and the substrate.

In one example of a method for making an electronic device package, a lateral portion of the underfill material comprises a lateral surface defined at least in part by the side wall of the recess.

In one example of a method for making an electronic device package, the side wall of the recess comprises one or more side walls disposed about a periphery of the electronic component.

In one example there is provided a method of controlling an underfill material keep out zone (KOZ) of an electronic component comprising obtaining a substrate, and forming a recess in the substrate at least partially defining an electronic component region, wherein a side wall of the recess is configured to mechanically inhibit flow of an underfill material.

In one example of a method of controlling an underfill KOZ of an electronic component, forming a recess in the substrate comprises removing material from the substrate.

In one example of a method of controlling an underfill KOZ of an electronic component, removing material from the substrate comprises etching the substrate.

In one example of a method of controlling an underfill KOZ of an electronic component, removing material from the substrate comprises mechanically removing material from the substrate.

In one example of a method of controlling an underfill KOZ of an electronic component, removing material from the substrate comprises laser removal of material from the substrate.

In one example of a method of controlling an underfill KOZ of an electronic component, removing material from the substrate comprises chemical removal of material from the substrate.

In one example of a method of controlling an underfill KOZ of an electronic component, the side wall of the recess comprises one or more side walls configured to be disposed about a periphery of an electronic component in the electronic component region.

In one example, a method of controlling an underfill KOZ of an electronic component further comprises facilitating distribution of underfill material in the recess.

In one example of a method of controlling an underfill KOZ of an electronic component, facilitating distribution of underfill material in the recess comprises forming one or more flow guides in the recess.

In one example of a method of controlling an underfill KOZ of an electronic component, the one or more flow guides form one or more channels in the recess.

In one example of a method of controlling an underfill KOZ of an electronic component, the one or more flow guides are formed at least partially by one or more traces.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device package, comprising:
   a substrate having a recess, the recess having a side wall oriented at a non-perpendicular angle relative to, and extending from, a top surface of the substrate;
   an electronic component disposed in the recess and electrically coupled to the substrate; and
   an underfill material disposed in the recess between the electronic component and the substrate;
   wherein a depth of the recess is equal to or greater than a gap between the electronic component and a bottom surface of the recess.

2. The electronic device package of claim 1, wherein a second side wall of the recess is oriented at a perpendicular angle relative to a top surface of the substrate.

3. The electronic device package of claim 1, wherein the side wall of the recess oriented at the non-perpendicular angle relative to the top surface of the substrate extends to a bottom surface of the recess.

4. The electronic device package of claim 1, wherein the recess comprises a dispense well to receive the underfill material.

5. The electronic device package of claim 1, wherein the recess is formed at least in part by solder resist material.

6. The electronic device package of claim 1, further comprising one or more flow guides to facilitate distribution of the underfill material in the recess between the electronic component and the substrate.

7. The electronic device package of claim 1, wherein a lateral portion of the underfill material comprises a meniscus surface extending between the electronic component and the substrate.

8. The electronic device package of claim 1, wherein one or more side walls of the recess are disposed about a periphery of the electronic component.

9. The electronic device package of claim 1, wherein the electronic component comprises a semiconductor device.

10. The electronic device package of claim 1, wherein the electronic component is coupled to the substrate through a plurality of solder bumps.

11. A computing system, comprising:
    a motherboard; and
    an electronic device package as in claim 1 operably coupled to the motherboard.

12. The system of claim 11, wherein the computing system comprises a desktop computer, a laptop, a tablet, a smartphone, a server, or a combination thereof.

13. The system of claim 11, further comprising a processor, a memory device, a heat sink, a radio, a slot, a port, or a combination thereof operably coupled to the motherboard.

14. A method for making an electronic device package, comprising:
    disposing an electronic component in a recess of a substrate, such that the electronic component is electrically coupled to the substrate, the recess having a side wall oriented at a non-perpendicular angle relative to, and extending from, a top surface of the substrate; and
    disposing an underfill material in the recess between the electronic component and the substrate, wherein flow of the underfill material is mechanically inhibited by the side wall of the recess;
    wherein disposing the underfill material in the recess comprising printing the underfill material in the recess including:
        disposing a stencil about the substrate, the stencil having an aperture corresponding to a dispense well of the recess;
        causing the underfill material to pass through the aperture and into the dispense well; and
        removing the stencil;
    wherein a lateral portion of the underfill material comprises a meniscus surface extending between the electronic component and the substrate.

15. The method of claim 14, wherein a lateral portion of the underfill material comprises a lateral surface defined at least in part by the side wall of the recess.

16. The method of claim 14, wherein one or more side walls are disposed about a periphery of the electronic component.

* * * * *